(12) United States Patent
Louh

(10) Patent No.: US 8,016,582 B2
(45) Date of Patent: Sep. 13, 2011

(54) APPARATUS AND METHOD FOR MANUFACTURING OPTICAL ELEMENTS

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 155 days.

(21) Appl. No.: 12/478,789

(22) Filed: Jun. 5, 2009

(65) Prior Publication Data
US 2010/0025868 A1    Feb. 4, 2010

(30) Foreign Application Priority Data
Jul. 31, 2008    (CN) .......................... 2008 1 0303298

(51) Int. Cl.
*B28B 17/00* (2006.01)
(52) U.S. Cl. ......... 425/150; 425/169; 425/808; 425/385
(58) Field of Classification Search ............... 264/1.32; 425/150, 412, 385, 423, 466, 468, 169, 171; 356/237.4, 237.5, 388, 401, 399, 400; 65/323; 29/721; 359/621
See application file for complete search history.

(56) References Cited

U.S. PATENT DOCUMENTS

| | | | | |
|---|---|---|---|---|
| 2004/0021254 A1* | 2/2004 | Sreenivasan et al. | .......... | 264/406 |
| 2006/0127522 A1* | 6/2006 | Chou | ............................ | 425/150 |
| 2007/0242272 A1* | 10/2007 | Suehira et al. | ................ | 356/401 |

* cited by examiner

*Primary Examiner* — Yogendra Gupta
*Assistant Examiner* — Ninh Le
(74) *Attorney, Agent, or Firm* — Altis Law Group, Inc.

(57) ABSTRACT

An apparatus for manufacturing optical elements at wafer level includes a lower mold core, an upper mold core, an aligning plate and an image pick-up device. The lower mold core has a lower alignment mark. The upper mold core has an upper alignment mark. The aligning plate has a first middle alignment mark corresponding to the lower alignment mark and a second middle alignment mark corresponding to the upper alignment mark. The image pick-up device is configured for capturing and analyzing images of the alignment marks to align the lower mold core, the aligning plate and the upper mold core.

13 Claims, 6 Drawing Sheets

Providing an apparatus comprising a lower mold core, an upper mold core, an aligning plate disposed between the lower mold core and the upper mold core, an image picking unit with a first and a second working modes, and an image analyzing unit connected with the image picking unit Aligning the lower mold core and the aligning plate by operating the image picking unit in a first working mode and analyzing the captured images Aligning the upper mold core and the aligning plate by operating the image capturing unit in a second working mode and analyzing the captured images Removing the aligning plate Applying raw material resin on the lower mold core and pressing the raw material resin with the upper mold core to form optical elements

FIG. 6

APPARATUS AND METHOD FOR MANUFACTURING OPTICAL ELEMENTS

BACKGROUND

1. Technical Field

The present disclosure relates to molding technology, particularly to an apparatus and a method for molding optical elements, such as wafer-level lenses.

2. Description of Related Art

Wafer level camera technology is designed to advance the integration of miniaturized cameras into cellular phones, PCs, security cameras and other portable electronic devices. To manufacture cameras at the wafer level, thousands of lenses are built simultaneously on a wafer, and a plurality of wafers are aligned and bonded together. The bonded wafers are diced into individual integrated optical elements that can be mounted onto a packaged image sensor. This technology drastically reduces the size and cost of camera modules.

A typical mold for molding lenses at the wafer level includes an upper mold core and a lower mold core. The upper mold core has an upper molding surface. The lower mold core has a lower molding surface corresponding to the upper molding surface. The upper molding surface and the lower molding surface cooperatively define a molding cavity to mold wafer-level lenses. The upper mold core and the lower mold core must be precisely aligned with each other to ensure good optical properties of the lenses. However, it is difficult to precisely align the upper mold and the lower mold.

What is needed, therefore, is an apparatus and a method for manufacturing miniature optical elements which can overcome the above-described problem.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views, and all the views are schematic.

FIG. 6 is a flowchart of a method for manufacturing optical elements.

DETAILED DESCRIPTION

Various embodiments will now be described in detail below and with reference to the drawings.

Figure 1:
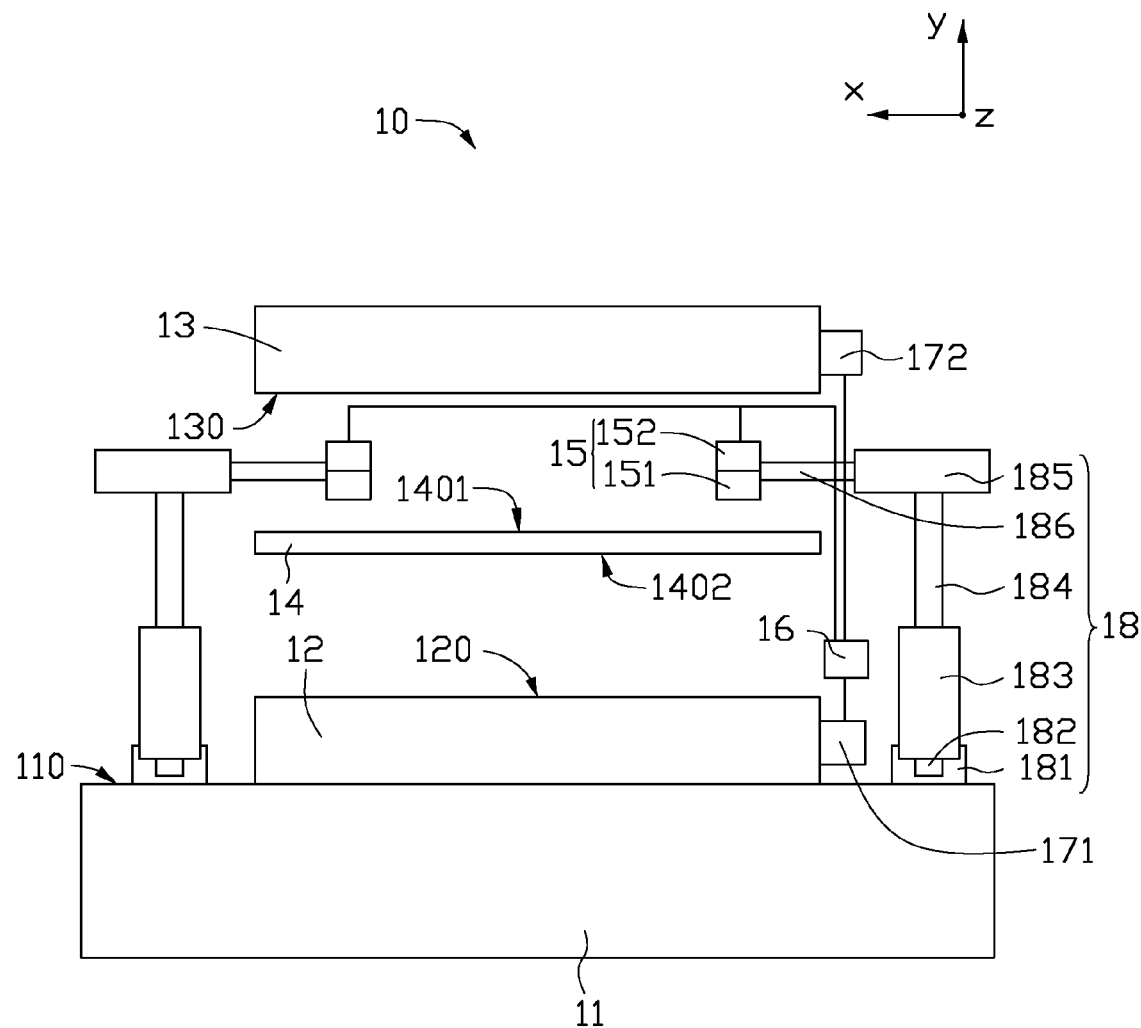
FIG. 1 is a side view of an apparatus for manufacturing miniature optical elements, according to an exemplary embodiment; wherein the apparatus includes a lower mold core, an upper mold core, an aligning plate, two image pick-up devices and two supporting members, and the image pick-up devices are positioned between the upper mold core and the aligning plate.

Referring to FIG. 1, this shows an apparatus 10 for manufacturing miniature optical elements, such as wafer level lenses, according to an exemplary embodiment. The apparatus 10 includes a base 11, a lower mold core 12, an upper mold core 13, an aligning plate 14, two image pick-up devices 15, and two supporting members 18. The base 11 has a mounting surface 110. The lower mold core 12 is disposed at a middle area of the mounting surface 110. The upper mold core 13 is disposed above and generally opposite to the lower mold core 12. The lower mold core 12 and the upper mold core 13 are configured for cooperatively defining molding cavities to mold optical elements (e.g. lenses, spacers, filters, etc.). The two image pick-up devices 15 are rotatably or detachably mounted on the two supporting members 18, respectively. The two supporting members 18 are mounted at a peripheral area of the mounting surface 110, at two opposite sides of the lower mold core 12, respectively.

The two supporting members 18 can be robotic arms or three-dimensional driving elements. In the illustrated embodiment, the supporting members 18 each include a first air cylinder 181, a first connecting rod 182, a second air cylinder 183, a second connecting rod 184, a third air cylinder 185, and a third connecting rod 186. The third connecting rod 186 extends along an x-axis, the second connecting rod 184 extends along a y-axis, and the first connecting rod 182 extends along a z-axis. One end of the third connecting rod 186 is rotatably mounted with a corresponding one of the image pick-up devices 15, and another end of the third connecting rod 186 is connected with a piston (not shown) inside the third air cylinder 185. The third air cylinder 185 is configured for driving the image pick-up device 15 to move along a direction parallel to the x-axis. One end of the second connecting rod 184 is connected with the third air cylinder 185, and another end of the second connecting rod 184 is connected with a piston (not shown) inside the second air cylinder 183. The second air cylinder 183 is configured for driving the third air cylinder 185 and correspondingly the image pick-up device 15 to move along a direction parallel to the y-axis. One end of the first connecting rod 182 is connected with the second air cylinder 183, and another end of the first connecting rod 182 is connected with a piston (not shown) inside the first air cylinder 181. The first air cylinder 181 is configured for driving the second air cylinder 183 and correspondingly the image pick-up device 15 to move along a direction parallel to the z-axis. Therefore the image pick-up devices 15 can move along each of the X, Y and Z axes and be positioned at any desired location.

It is noted that the number of supporting members 18 is not limited to two, and correspondingly the number of image pick-up devices 15 is not limited to two. In general, the number of image pick-up devices 15 is the same as the number of supporting members 18.

Figure 2:
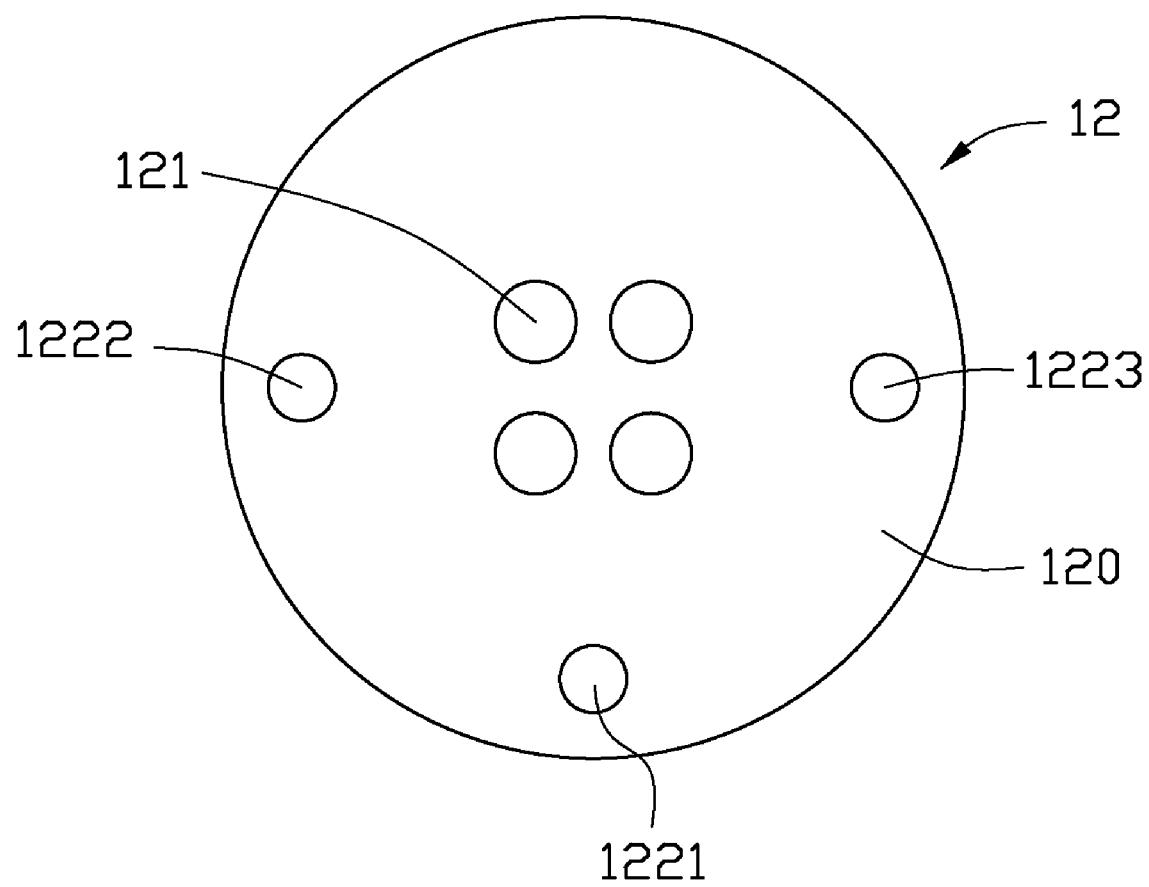
FIG. 2 is a top view of the lower mold core of FIG. 1.

Referring also to FIG. 2, the lower mold core 12 is in the shape of a cylinder, and has a circular lower molding surface 120. The lower molding surface 120 defines at least one lower lens cavity 121 and at least one lower alignment mark. Preferably, the lower molding surface 120 defines at least three lower alignment marks. In the illustrated embodiment, the lower molding surface 120 defines four lower lens cavities 121 and three lower alignment marks, i.e., a first lower alignment mark 1221, a second lower alignment mark 1222, and a third lower alignment mark 1223. The four lower lens cavities 121 are defined at a central area of the lower molding surface 120, and are equally angularly spaced from one another about the center of the lower molding surface 120. The three lower alignment marks 1221, 1222, and 1223 are defined at a peripheral area of the lower molding surface 120, along an imaginary circle centered at the center of the lower molding surface 120. Specifically, the three lower alignment marks 1221, 1222, and 1223 are located at three points of an isosceles triangle. In detail, the first lower alignment mark 1221 is located at a vertex of the isosceles triangle, and the second and third lower alignment marks 1222 and 1223 are located diametrically opposite each other at two opposite sides of the plurality of lower lens cavities 121 along a diameter of the lower molding surface 120. It is noted that each of the lower alignment marks 1221, 1222, and 1223 is not limited to being circular as shown in FIG. 2. Other shapes may be adopted for each of the lower alignment marks 1221, 1222, and 1223 as desired.

Figure 3:
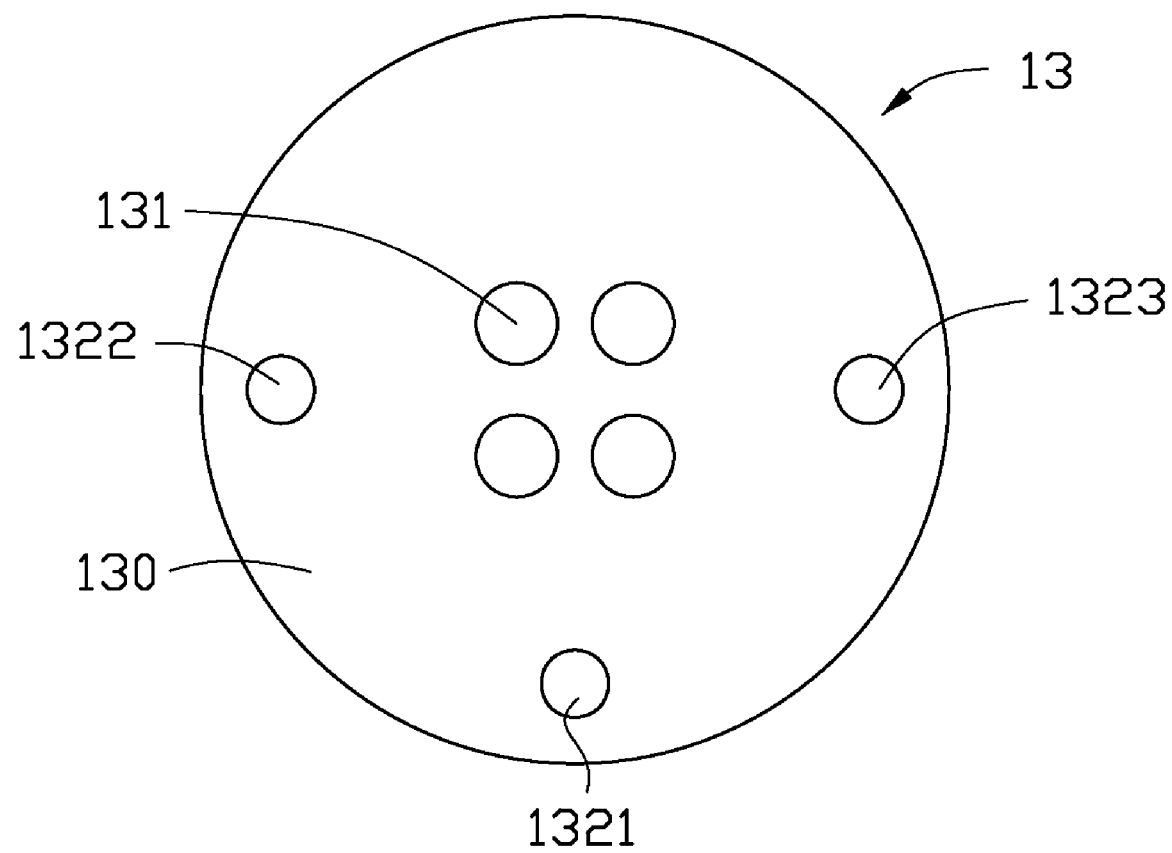
FIG. 3 is a bottom view of the upper mold core of FIG. 1.

Referring also to FIG. 3, the upper mold core 13 has a circular upper molding surface 130, which is generally opposite to the lower molding surface 120. In the illustrated embodiment, the upper molding surface 130 defines four upper lens cavities 131 and three upper alignment marks, i.e., a first upper alignment mark 1321, a second upper alignment mark 1322, and a third upper alignment mark 1323. The four upper lens cavities 131 are defined at a central area of the upper molding surface 130, corresponding to the four lower lens cavities 121, respectively. The upper lens cavities 131 and the lower lens cavities 122 together define four lens molding cavities, each configured for forming a lens by pressurizing raw material resin. The three upper alignment marks 1321, 1322, and 1323 are defined at a peripheral area of the upper molding surface 130.

The first upper alignment mark 1321 is not located at a position corresponding to the first lower alignment mark 1211, but rather at a position corresponding to a side of the lower molding surface 120 opposite from the first lower alignment mark 1211. The second upper alignment mark 1322 is located at a position corresponding to the second lower alignment mark 1222. The third upper alignment mark 1323 is located at a position corresponding to the third lower alignment mark 1213. The three upper alignment marks 1321, 1322, and 1323 are defined along an imaginary circle centered at the center of the upper molding surface 130. Specifically, the three upper alignment marks 1321, 1322, and 1323 are located at three points of an isosceles triangle. In detail, the first upper alignment mark 1321 is located at a vertex of the isosceles triangle, the second and third upper alignment marks 1322 and 1323 are located diametrically opposite each other at two opposite sides of the plurality of upper lens cavities 131 along a diameter of the upper molding surface 130. It is noted that in an alternative embodiment, the upper alignment marks 1321, 1322, and 1323 can directly correspond to the lower alignment marks 1221, 1222, and 1223, respectively.

Figure 4:
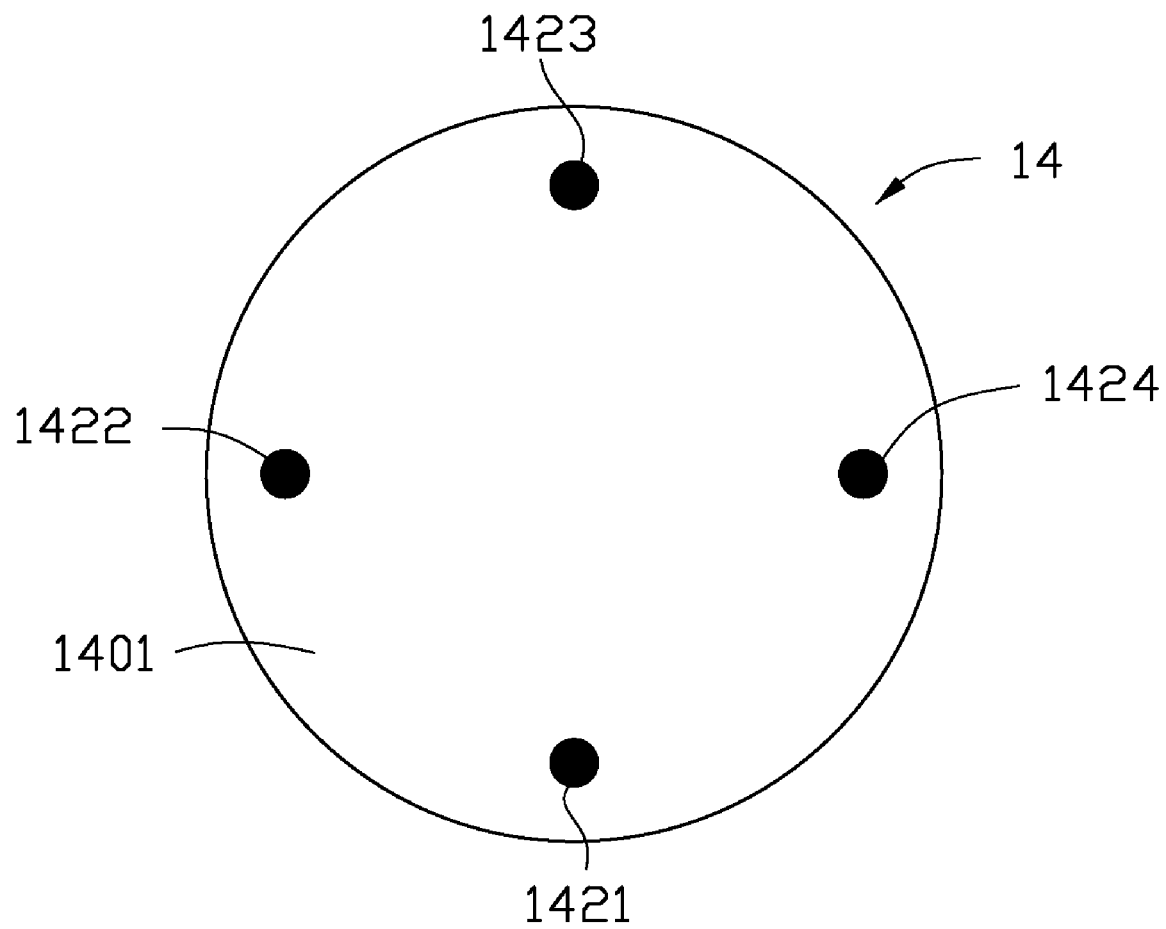
FIG. 4 is a top view of the aligning plate of FIG. 1.

Referring also to FIG. 4, the aligning plate 14 is a transparent circular plate, and has a first circular surface 1401 and a second circular surface 1402 at opposite sides thereof. A number of opaque alignment marks, corresponding to the lower and upper alignment marks 1221, 1222, 1223, 1321, 1322, and 1323, are defined in or on the first surface 1401 or in or on the second surface 1402. Each of the opaque alignment marks has a size smaller than that of the respective alignment mark defined in the lower mold core 12 and/or upper mold core 13. In the illustrated embodiment, there are four opaque alignment marks. The four opaque alignment marks are a first opaque alignment mark 1421, a second opaque alignment mark 1422, a third opaque alignment mark 1423, and a fourth opaque alignment mark 1424, which are defined at a peripheral area of the first surface 1401. The four opaque alignment marks 1421, 1422, 1423, and 1424 are defined along an imaginary circle centered at the center of the first surface 1401, and are equally angularly spaced from one another about the center of the first surface 1401.

The first opaque alignment mark 1421 is located at a position corresponding to the first lower alignment mark 1221. The second opaque alignment mark 1422 is located at a position corresponding to the first upper alignment mark 1321. The third opaque alignment mark 1423 is located at a position corresponding to the second lower alignment mark 1222 and the second upper alignment mark 1322. The fourth opaque alignment mark 1424 is located at a position corresponding to the third lower alignment mark 1223 and the third upper alignment mark 1323. Thus, the first, third and fourth opaque alignment marks 1421, 1423, and 1424 constitute a first set of middle alignment marks, which correspond to the lower alignment marks 1221, 1222, and 1223 defined in (or on) the lower mold core 12. The second, third and fourth opaque alignment marks 1422, 1423, and 1424 constitute a second set of middle alignment marks, which correspond to the upper alignment marks 1321, 1322, and 1323 defined in (or on) the upper mold core 13.

The image pick-up devices 15 each can be video microscope systems, and each can comprise an image pick-up unit 151 and an image analyzing unit 152 connected with the image pick-up unit 151. The image pick-up unit 151 is configured for capturing images of the alignment marks of the lower mold core 12, the aligning plate 14 and the upper mold core 13. The image analyzing unit 152 is configured for analyzing images captured by the image pick-up unit 151 to obtain information on alignment accuracy of the lower mold core 12, the aligning plate 14 and the upper mold core 13.

By controlling and adjusting the supporting members 18, the image pick-up devices 15 can move and rotate relative to the base 11, the lower mold core 12 and the upper mold core 13. In this embodiment, the image pick-up devices 15 have two working locations and two working modes.

In the first working mode, referring to FIG. 1, the image pick-up devices 15 are located between the upper mold core 13 and the aligning plate 14, and the image pick-up units 151 face toward the first surface 1401. Thus, the image pick-up units 151 can capture images of the lower alignment marks 1221, 1222, and 1223 and the corresponding opaque alignment marks 1421, 1423, and 1424, and the image analyzing unit 152 can analyze the images thereof to obtain information on an alignment accuracy of the lower mold core 12 and the aligning plate 14. In detail, the image pick-up unit 151 of one of the image pick-up devices 15 can capture images of the first lower alignment mark 1221 and the first opaque alignment mark 1421, while simultaneously the image pick-up unit 151 of the other image pick-up device 15 can capture images of the second lower alignment mark 1222 and the third opaque alignment mark 1423. Then one of the image pick-up units 151 can capture images of the third lower alignment mark 1223 and the fourth opaque alignment mark 1424. Thus information on an alignment accuracy of the lower mold core 12 and the aligning plate 14 can be obtained by analyzing the aforementioned captured images, by the image analyzing units 152. According to the alignment accuracy information, the position of the lower mold core 12 can be manually or mechanically adjusted to precisely align with the aligning plate 14.

Figure 5:
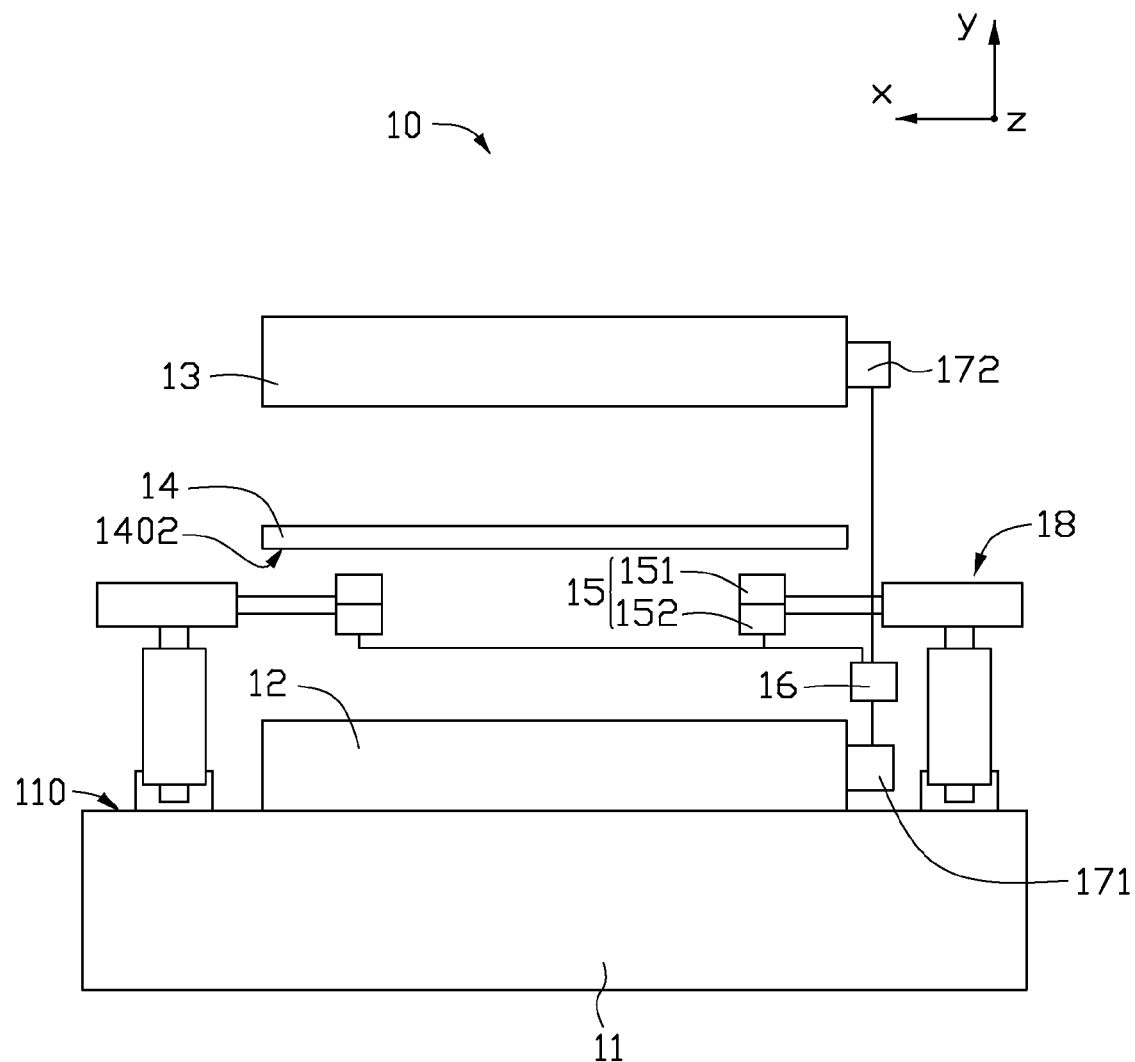
FIG. 5 is similar to FIG. 1, but showing the image pick-up devices positioned between the lower mold core and the aligning plate.

In the second working mode, referring to FIG. 5, the image pick-up devices 15 are located between the lower mold core 12 and the aligning plate 14, and the image pick-up units 151 face toward the second surface 1402. The image pick-up units 151 can capture images of the upper alignment marks 1321, 1322, and 1323 and the corresponding opaque alignment marks 1422, 1423, and 1424, and the image analyzing units 152 can analyze the images thereof to obtain information on an alignment accuracy of the upper mold core 13 and the aligning plate 14. In detail, one of the image pick-up units 151 can capture images of the first upper alignment mark 1321 and the second opaque alignment mark 1422, while simultaneously the image pick-up unit 151 of the other image pick-up device 15 can capture images of the second upper alignment mark 1322 and the third opaque alignment mark 1423. Then one of the image pick-up units 151 can capture images of the third upper alignment mark 1323 and the fourth opaque alignment mark 1424. Thus information on an alignment accuracy of the upper mold core 13 and the aligning plate 14 can be obtained by analyzing the aforementioned captured images, by the image analyzing units 152. According to the alignment accuracy information, the position of the upper mold core 13 can be manually or mechanically adjusted to precisely align with the aligning plate 14.

It is noted that the image pick-up devices 15 can instead be other suitable image capturing elements such as scanning microscope systems, digital cameras, and so on. It is understood that the number of image pick-up devices 15 is not limited to two. Only one image pick-up device 15, or three or more image pick-up devices 15, may be provided according to practical needs.

In the illustrated embodiment, the apparatus 10 further includes a processing unit 16, a first motor 171 and a second motor 172. The first motor 171 is mechanically coupled to the lower mold core 12, and can drive the lower mold core 12 to move relative to the base 11. The second motor 172 is mechanically coupled to the upper mold core 13, and can drive the upper mold core 13 to move relative to the base 11. The processing unit 16 is connected with the image analyzing units 152 of the image pick-up devices 15, the first motor 171, and the second motor 172, and is configured for controlling the first and second motors 171, 172 according to the alignment accuracy information on the lower mold core 12, upper mold core 13 and the aligning plate 14 derived from the images captured by the two image pick-up devices 15.

FIG. 6 is a flowchart of a method for manufacturing miniature optical elements, including steps below.

In step 1, the apparatus 10 as shown in FIGS. 1 to 5 is provided.

In step 2, referring to FIG. 1, the image pick-up devices 15 are positioned to operate in the first working mode, thereby the lower mold core 12 and the aligning plate 14 can be aligned.

Firstly, the two supporting members 18 are adjusted to make one image pick-up unit 151 aligned with the first lower alignment mark 1221 and the first opaque alignment mark 1421 and make the other image pick-up unit 151 aligned with the second lower alignment mark 1222 and the third opaque alignment mark 1423, and therefore images thereof can be captured. Then one of the image pick-up devices 15 is driven by the corresponding supporting member 18 to be aligned with the third lower alignment mark 1223 and the fourth opaque alignment mark 1424, and thus images of the third lower alignment mark 1223 and the fourth opaque alignment mark 1424 can be captured. Then, information on an alignment accuracy of the lower mold core 12 and the aligning plate 14 can be obtained by analyzing the aforementioned captured images by the image analyzing units 152.

Secondly, the processing unit 16 obtains the alignment accuracy information from the image pick-up devices 15, and the first motor 171 is driven to make the lower mold core 12 moving relative to the aligning plate 14 until the lower mold core 12 and the aligning plate 14 are precisely aligned.

In step 3, referring to FIG. 5, the image pick-up devices 15 are positioned to operate in the second working mode, thereby the upper mold core 13 and the aligning plate 14 can be aligned.

Firstly, the image pick-up devices 15 are moved to locations between the lower mold core 12 and the aligning plate 14 by the supporting members 18. Then the image pick-up devices 15 are rotated 180 degrees about the x-axis to face toward the second surface 1402 of the aligning plate 14.

Secondly, the image pick-up units 151 capture images of the upper alignment marks 1321, 1322, and 1323 and the corresponding opaque alignment marks 1422, 1423, and 1424, and the image analyzing units 152 analyze the images thereof to obtain information on an alignment accuracy of the upper mold core 13 and the aligning plate 14.

Thirdly, the processing unit 16 obtains the alignment accuracy information, and the second motor 172 is driven to make the upper mold core 13 move relative to the aligning plate 14 until the upper mold core 13 and the aligning plate 14 are precisely aligned.

In step 4, the aligning plate 14 is taken out from between the upper mold core 13 and the lower mold core 12.

In step 5, raw material resin is applied on the lower molding surface 120 of the lower mold core 12, and is pressed by the upper mold core 13. Therefore, raw material resin is accommodated in molding cavities to form miniature optical elements, e.g. lenses at the wafer level.

In the present embodiment, the apparatus 10 includes the aligning plate 14 and the image pick-up devices 15. Thus the upper mold core 13 and the lower mold core 12 can be precisely aligned with the aligning plate 14. Then the optical axis of each of the lenses manufactured by the apparatus 10 can be precise. That is, "tilting" of the optical axes or other aberrations of the lenses can be avoided.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

The invention claimed is:

1. An apparatus for manufacturing optical elements, the apparatus comprising:
    a base;
    a lower mold core mounted on the base, the lower mold core having a lower molding surface with at least one first lower alignment mark defined thereat;
    an upper mold core having an upper molding surface generally opposite to the lower molding surface, at least one first upper alignment mark being defined at the upper molding surface;
    a transparent aligning plate comprising a plurality of opaque alignment marks, the opaque alignment marks including at least one first opaque alignment mark corresponding to the at least one first lower alignment mark and at least one second opaque alignment mark corresponding to the at least one first upper alignment mark; and
    an image pick-up device movably mounted to the base, the image pick-up device configured for being positioned between the upper mold core and the aligning plate and capturing at least one image of the at least one first opaque alignment mark and the at least one first lower alignment mark to analyze alignment accuracy between the lower mold core and the aligning plate, and configured for being positioned between the lower mold core and the aligning plate and capturing at least one image of the at least one second opaque alignment mark and the at least one first upper alignment mark to analyze alignment accuracy between the upper mold core and the aligning plate.

2. The apparatus as claimed in claim 1, further comprising a supporting member configured for mounting the image pick-up device thereto.

3. The apparatus as claimed in claim 2, wherein the supporting member is a robotic arm.

4. The apparatus as claimed in claim 1, wherein the image pick-up device is a video microscope system.

5. The apparatus as claimed in claim 1, wherein the image pick-up device comprises an image pick-up unit and an image analyzing unit connected with the image pick-up unit, the image pick-up unit is configured for capturing the images, and the image analyzing unit is configured for analyzing the alignment accuracy between the upper mold core, the aligning plate, and the lower mold core according to the captured images.

6. The apparatus as claimed in claim 5, further comprising a first motor, a second motor and a processing unit, the first motor being mechanically coupled to the lower mold core, the second motor being mechanically coupled to the upper mold core, and the processing unit being connected with the first motor, the second motor, and the image analyzing unit and being configured for controlling the first and second motors according to the alignment accuracy obtained from the image analyzing unit.

7. The apparatus as claimed in claim 1, wherein the at least one first and the at least one second opaque alignment marks each have a size smaller than any of the at least one first lower and at least one first upper alignment marks.

8. The apparatus as claimed in claim 1, wherein the at least one first opaque alignment mark and the at least one second opaque alignment mark are located at two opposite sides of the center of the aligning plate.

9. The apparatus as claimed in claim 8, wherein the lower molding surface further comprises a second lower alignment mark defined thereat, the upper molding surface further comprises a second upper alignment mark defined thereat, the transparent aligning plate further comprises a third opaque alignment mark defined thereat, and the third opaque alignment mark corresponds to both the second lower alignment mark and the second upper alignment mark.

10. The apparatus as claimed in claim 8, wherein the lower molding surface further comprises a second lower alignment mark defined thereat, the upper molding surface further comprises a second upper alignment mark defined thereat, the transparent aligning plate further comprises a third opaque alignment mark and a fourth opaque alignment mark defined thereat, the third opaque alignment mark corresponds to the second lower alignment mark, and the fourth opaque alignment mark corresponds to the second upper alignment mark.

11. The apparatus as claimed in claim 10, wherein the opaque alignment marks are equally angularly spaced from one another about the center of the aligning plate.

12. The apparatus as claimed in claim 1, wherein the at least one first opaque alignment mark and the at least one second opaque alignment mark coincide with each other.

13. The apparatus as claimed in claim 8, wherein the number of the opaque alignment marks is equal to or greater than three, the number of the at least one lower alignment mark is equal to or greater than three, and the number of the at least one upper alignment mark is equal to or greater than three.

* * * * *